(12) United States Patent
Kim

(10) Patent No.: US 10,389,349 B2
(45) Date of Patent: Aug. 20, 2019

(54) SEMICONDUCTOR APPARATUS INCLUDING A POWER GATING CIRCUIT

(71) Applicant: SK hynix Inc., Icheon-si, Gyeonggi-do (KR)

(72) Inventor: Woongrae Kim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/856,513

(22) Filed: Dec. 28, 2017

(65) Prior Publication Data
US 2018/0358960 A1    Dec. 13, 2018

(30) Foreign Application Priority Data

Jun. 13, 2017 (KR) .................. 10-2017-0073887

(51) Int. Cl.
| H03K 17/14 | (2006.01) |
| H03K 5/14 | (2014.01) |
| H03K 19/00 | (2006.01) |
| H03K 5/00 | (2006.01) |

(52) U.S. Cl.
CPC ............. *H03K 17/145* (2013.01); *H03K 5/14* (2013.01); *H03K 19/0016* (2013.01); *H03K 2005/00019* (2013.01)

(58) Field of Classification Search
None
See application file for complete search history.

(56) References Cited

U.S. PATENT DOCUMENTS

| 7,336,101 B2 * | 2/2008 | Kim ................... H03K 19/0185 326/26 |
| 8,896,354 B1 * | 11/2014 | Hong ..................... H03K 19/00 327/108 |
| 2007/0070783 A1 * | 3/2007 | Lee .......................... G11C 8/10 365/230.06 |
| 2008/0197914 A1 * | 8/2008 | Shimizu ............. H03K 19/0013 327/541 |
| 2015/0249449 A1 | 9/2015 | Cai et al. |

* cited by examiner

*Primary Examiner* — Cassandra F Cox
(74) *Attorney, Agent, or Firm* — William Park & Associates Ltd.

(57) ABSTRACT

A semiconductor apparatus may include a logic circuit and a power gating circuit including a gating transistor configured to apply a first supply voltage to the logic circuit based on an operation mode of the semiconductor apparatus. The semiconductor apparatus may be configured to monitor a characteristic of the logic circuit and adjust aback bias voltage to the gating transistor based on the characteristic of the logic circuit.

19 Claims, 7 Drawing Sheets

SEMICONDUCTOR APPARATUS INCLUDING A POWER GATING CIRCUIT

CROSS-REFERENCES TO RELATED APPLICATION

The present application claims priority under 35 U.S.C. § 119(a) to Korean application number 10-2017-0073887, filed on Jun. 13, 2017, in the Korean Intellectual Property Office, which is incorporated herein by reference in its entirety.

BACKGROUND

1. Technical Field

Various embodiments generally relate to a semiconductor technology, and more particularly, to a power gating circuit and a semiconductor apparatus using the same.

2. Related Art

Electronic devices may include many electronic components. Among the electronic devices, a computer system may include a large number of electronic components implemented with semiconductors. Semiconductor apparatuses constituting a computer system may be operated by a supply voltage applied thereto. The supply voltage may be applied from an external power source such as a power management integrated circuit. The semiconductor apparatuses may be operated in various operation modes. In general, the semiconductor apparatuses may be operated in an active mode and standby mode. The active mode may refer to a mode in which the semiconductor apparatus actually performs available functions, and the standby mode may refer to a sleep mode in which the semiconductor apparatus consumes the minimum power. The semiconductor apparatuses may use a power gating circuit in order to minimize the power consumption in the standby mode. The power gating circuit may connect various logic circuits constituting the semiconductor apparatus to a terminal to which a supply voltage is applied, and apply the supply voltage to the various logic circuits. In the standby mode of the semiconductor apparatus, the power gating circuit may block the connections between the supply voltage and the logic circuits, thereby reducing the power consumption.

In general, the power gating circuit may include transistors. However, the transistors may have a process skew and/or variation depending on a fabrication environment, and have a variation depending on temperature in an operational situation. Therefore, when the transistors are uniformly controlled, power gating efficiency may be reduced.

SUMMARY

In an embodiment, a semiconductor apparatus may be provided. The semiconductor apparatus may include a logic circuit. The semiconductor apparatus may include a power gating circuit including a first gating transistor configured to apply a first supply voltage to the logic circuit based on an operation mode of the semiconductor apparatus. The semiconductor apparatus may include a characteristic monitoring circuit configured to generate characteristic information by monitoring a characteristic of the logic circuit. The semiconductor apparatus may include a power gating control circuit configured to supply a first back bias voltage to the first gating transistor based on the characteristic information.

In an embodiment, a semiconductor apparatus may be provided. The semiconductor apparatus may include a first logic circuit. The semiconductor apparatus may include a first power gating circuit including a first gating transistor configured to apply a first supply voltage to the first logic circuit based on an operation mode of the semiconductor apparatus. The semiconductor apparatus may include a second logic circuit. The semiconductor apparatus may include a second power gating circuit including a second gating transistor configured to apply the first supply voltage to the second logic circuit based on the operation mode of the semiconductor apparatus. The semiconductor apparatus may include a characteristic monitoring circuit configured to generate first characteristic information by monitoring a characteristic of the first logic circuit, and to generate second characteristic information by monitoring a characteristic of the second logic circuit. The semiconductor apparatus may include a power gating control circuit configured to provide a first back bias voltage to the first gating transistor based on the first characteristic information, and to provide a second back bias voltage to the second gating transistor based on the second characteristic information.

DETAILED DESCRIPTION

Hereinafter, a power gating circuit and a semiconductor apparatus using the same according to the present disclosure will be described below with reference to the accompanying drawings through examples of embodiments.

Figure 1:
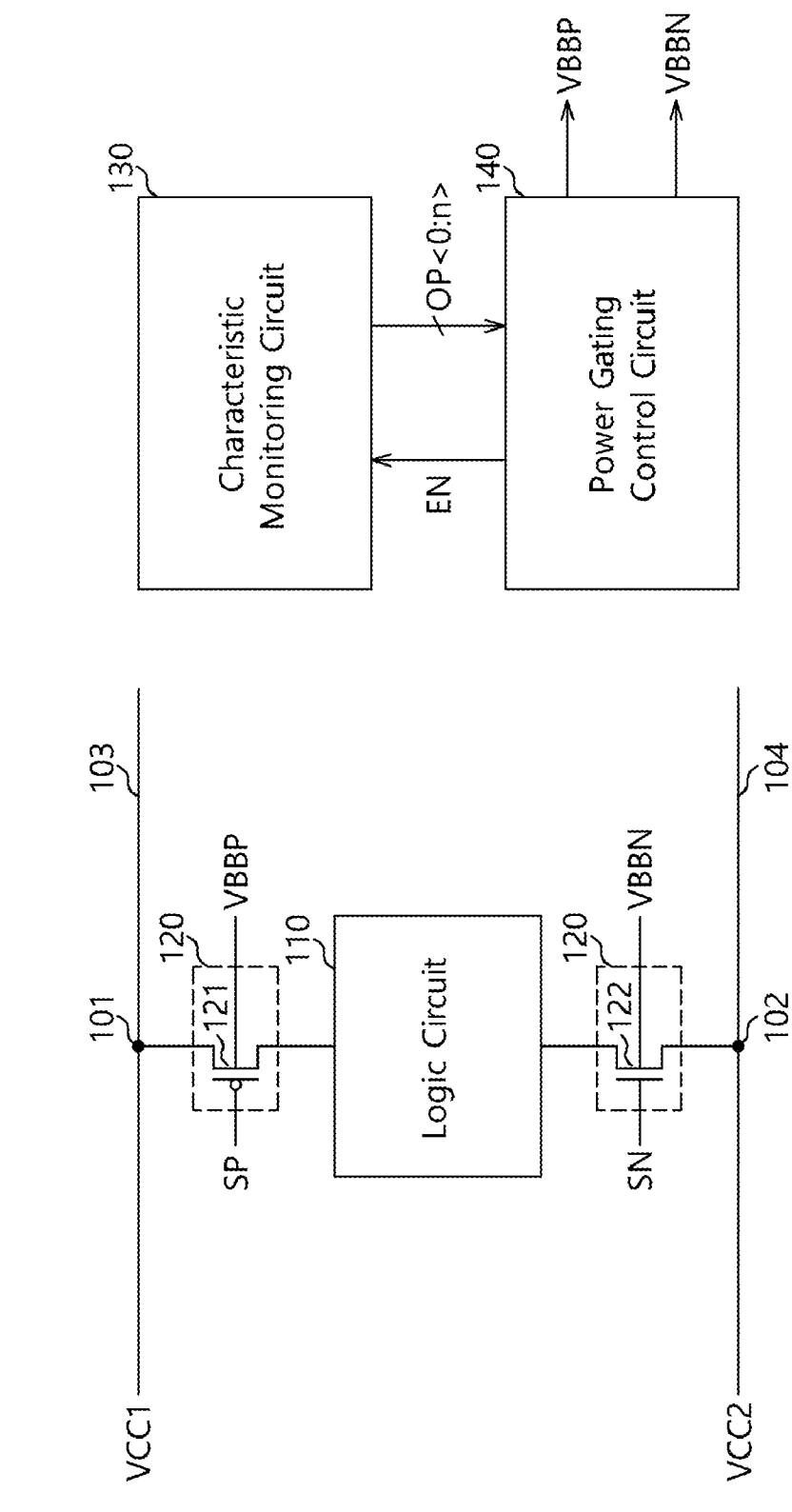
FIG. 1 is a diagram illustrating a representation of an example of the configuration of a semiconductor apparatus according to an embodiment.

FIG. 1 is a diagram illustrating a representation of an example of the configuration of a semiconductor apparatus 1 according to an embodiment. Referring to FIG. 1, the semiconductor apparatus 1 may include a logic circuit 110 and a power gating circuit 120. The logic circuit 110 may be operated by first and second supply voltages VCC1 and VCC2 supplied thereto. The first supply voltage VCC1 may include a high voltage, for example, an external supply voltage applied from an external power supply. The second supply voltage may include a low voltage, for example, a ground voltage. However, the types and levels of the first and second supply voltages VCC1 and VCC2 are not limited thereto, but the first and second supply voltages VCC1 and VCC2 may be changed depending on the type and function of the logic circuit.

The power gating circuit 120 may couple a first supply voltage terminal 101 to the logic circuit 110. The power gating circuit 120 may include a first gating transistor 121. The first gating transistor 121 may couple the first supply voltage terminal 101 to the logic circuit 110 based on a gating control signal SP. The first gating transistor 121 may apply the first supply voltage VCC1 to the logic circuit 110 based on the gating control signal SP. The first supply voltage terminal 101 may be connected to a power line and/or mesh 103 to which the first supply voltage VCC1 is supplied. The gating control signal SP may be enabled or disabled depending on an operation mode of the semiconductor apparatus 1. The semiconductor apparatus 1 may be operated in various modes. For example, the semiconductor apparatus 1 may be operated in an active operation mode in which the semiconductor apparatus 1 can perform various functions or a standby mode in which the semiconductor apparatus 1 consumes the minimum power. The gating control signal SP may be enabled in the active operation mode of the semiconductor apparatus 1, and disabled in the standby mode of the semiconductor apparatus 1. When the gating control signal SP is enabled, the first gating transistor 121 may be turned on to apply the first supply voltage VCC1 to the logic circuit 110. Therefore, the logic circuit 110 may be operated by the first supply voltage VCC applied thereto. When the gating control signal SP is disabled, the first gating transistor 121 may be turned off. Then, the application of the first supply voltage VCC1 to the logic circuit 110 may be interrupted to block the current path.

The first gating transistor 121 may include a P-channel MOS transistor. The first gating transistor 121 may have a gate configured to receive the gating control signal SP, a source coupled to the first supply voltage terminal 101, and a drain coupled to the logic circuit 110. The first gating transistor 121 may receive a first back bias voltage VBBP. The first back bias voltage VBBP may be applied to the body or bulk of the first gating transistor 121. The first back bias voltage VBBP may include a body bias voltage or bulk bias voltage applied to the body or bulk of the first gating transistor 121. The first back bias voltage VBBP may adjust the threshold voltage of the first gating transistor 121. For example, the lower the level of the first back bias voltage VBBP, the lower the threshold voltage of the first gating transistor 121. Furthermore, the higher the level of the first back bias voltage VBBP, the higher the threshold voltage of the first gating transistor 121. The level of the first back bias voltage VBBP may be adjusted through an operation of monitoring the characteristics of the logic circuit 110.

The power gating circuit 120 may also couple the second supply voltage VCC2 to the logic circuit 110. The power gating circuit 120 may further include a second gating transistor 122. The second gating transistor 122 may couple the second supply voltage terminal 102 to the logic circuit 110 based on a gating control signal SN. The gating control signal SN may include an inverted signal of the gating control signal SP, for example. The second gating transistor 122 may apply the second supply voltage VCC2 to the logic circuit 110 based on the gating control signal SN. The second supply voltage terminal 102 may be coupled to a power line and/or mesh 104 to which the second supply voltage VCC2 is supplied. When the gating control signal SN is enabled, the second gating transistor 122 may be turned on to apply the second supply voltage VCC2 to the logic circuit 110. Therefore, the logic circuit 110 may be operated by the second supply voltage VCC2 applied thereto. When the gating control signal SN is disabled, the second gating transistor 122 may be turned off. Then, the application of the second supply voltage VCC2 to the logic circuit 110 may be interrupted to block the current path.

The second gating transistor 122 may include an N-channel MOS transistor. The second gating transistor 122 may have a gate configured to receive the gating control signal SN, a drain coupled to the logic circuit 110, and a source coupled to the second supply voltage terminal 102. The second gating transistor 122 may receive a second back bias voltage VBBN. The second back bias voltage VBBN may be applied to the body or bulk of the second gating transistor 122. The second back bias voltage VBBN may adjust the threshold voltage of the second gating transistor 122. For example, the higher the level of the second back bias voltage VBBN, the lower the threshold voltage of the second gating transistor 122. Furthermore, the lower the level of the second back bias voltage VBBN, the higher the threshold voltage of the second gating transistor 122. The level of the second back bias voltage VBBN may be adjusted through an operation of monitoring the characteristics of the logic circuit 110.

Referring to FIG. 1, the semiconductor apparatus 1 may monitor the characteristics of the logic circuit 110 in order to adjust the levels of the first and second back bias voltages VBBP and VBBN. The characteristics of the logic circuit 110 may include a process variation and/or temperature variation. The process variation may indicate a process skew of the logic circuit 110. When the process variation of the logic circuit 110 is faster than a reference variation, the semiconductor apparatus 1 may use the first back bias voltage VBBP having a higher level than a default value and the second back bias voltage VBBN having a lower level than the default value. When the process variation is slower than the reference variation, the semiconductor apparatus 1 may use the first back bias voltage VBBP having a lower level than the default value and the second back bias voltage VBBN having a higher level than the default value. The temperature variation may indicate the current temperature of the logic circuit 110. When the temperature of the logic circuit 110 is higher than a reference temperature, the semiconductor apparatus 1 may use the first back bias voltage VBBP having a lower level than the default value and the second back bias voltage VBBN having a higher level than the default value. When the temperature of the logic circuit 110 is lower than the reference temperature, the semiconductor apparatus 1 may use the first back bias voltage VBBP having a higher level than the default value and the second back bias voltage VBBN having a lower level than the default value.

The semiconductor apparatus 1 may include a characteristic monitoring circuit 130 and a power gating control circuit 140. The characteristic monitoring circuit 130 may generate characteristic information OP<0:n> by monitoring the characteristics of the logic circuit 110, where n is an integer equal to or more than 2. The characteristic monitoring circuit 130 may include a delay line configured by replicating the logic circuit 110. The delay line configured by replicating the logic circuit 110 may include transistors which are fabricated in substantially the same environment and/or condition as the transistors constituting the logic circuit 110. The characteristic monitoring circuit 130 may monitor characteristics related to a process variation and/or temperature variation of the logic circuit 110 through the delay line configured by replicating the logic circuit 110, and generate the characteristic information OP<0:n>.

The power gating control circuit 140 may adjust the levels of the first and second back bias voltages VBBP and VBBN based on the characteristic information OP<0:n>. The power gating control circuit 140 may adjust the levels of the first and second back bias voltages VBBP and VBBN such that the logic circuit 110 can perform a normal operation while consuming the minimum power based on the characteristic information OP<0:n> indicating the characteristics of the logic circuit 110. The power gating control circuit 140 may also generate an enable signal EN, and provide the enable signal EN to the characteristic monitoring circuit 130 in order to enable the characteristic monitoring circuit 130. The enable signal EN may be enabled when the semiconductor apparatus 1 is booted up, and periodically enabled after the semiconductor apparatus 1 is booted up. The characteristic monitoring circuit 130 may monitor the characteristics of the logic circuit 110 and generate the characteristic information OP<0:n>, whenever the enable signal EN is enabled. The power gating control circuit 140 may adjust the levels of the first and second back bias voltages VBBP and VBBN based on the characteristic information OP<0:n>. Therefore, whenever the enable signal EN is enabled, the characteristics of the logic circuit 110 may be monitored. According to the monitoring result, the levels of the first and second back bias voltages VBBP and VBBN applied to the first and second gating transistors 121 and 122 may be adjusted.

Figure 2:
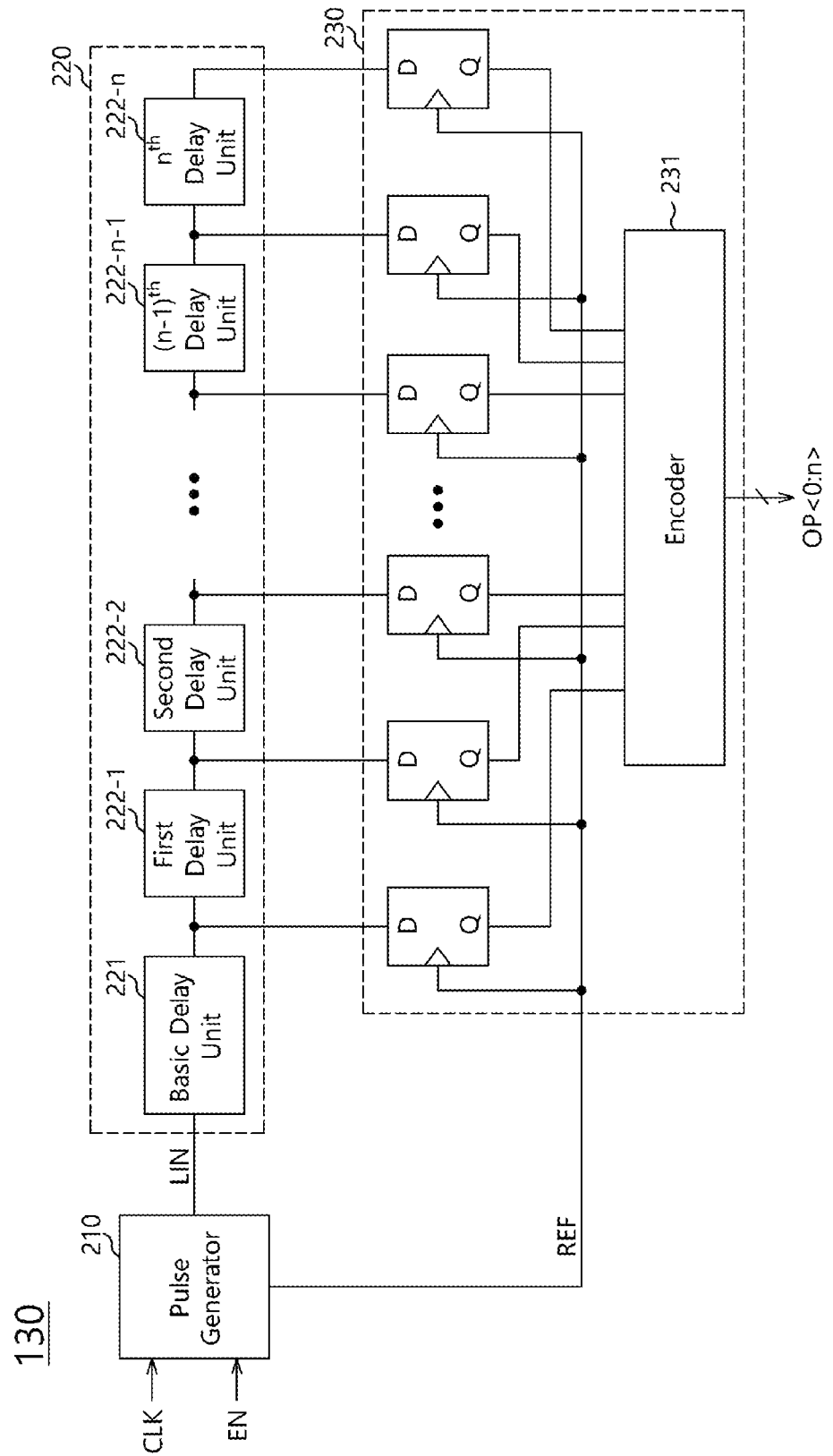
FIG. 2 is a diagram illustrating a representation of an example of the configuration of the characteristic monitoring circuit illustrated in FIG. 1.

FIG. 2 is a diagram illustrating a representation of an example of the configuration of the characteristic monitoring circuit 130 illustrated in FIG. 1. Referring to FIG. 2, the characteristic monitoring circuit 130 may include a pulse generator 210, a delay line 220 and a characteristic information generator 230. The pulse generator 210 may receive a clock signal CLK, and generate a level signal LIN and a reference signal REF based on the clock signal CLK. The level signal LIN may be enabled to a high level based on the clock signal CLK, and retain the enabled state. The reference signal REF may include a pulse signal which is enabled at a predetermined time after the clock signal CLK is received. For example, the reference signal REF may be enabled after a predetermined period of the clock signal CLK. The operating speed of the semiconductor apparatus 1 may be changed based on the clock signal CLK. For example, the semiconductor apparatus 1 may receive the clock signal CLK having a high frequency, and operate at a first frequency. Furthermore, the semiconductor apparatus 1 may receive the clock signal CLK having a low frequency, and operate at a second frequency. The pulse generator 210 may receive the enable signal EN. When the enable signal EN is enabled, the pulse generator 210 may generate and output the level signal LIN and the reference signal REF based on the clock signal CLK.

The delay line 220 may receive the level signal LIN. The delay line 220 may include a plurality of delay units. The plurality of delay units may be coupled in series, and sequentially delay the level signal LIN. The delay line 220 may include a basic delay unit 221 and first to nth delay units 222-1 to 222-n. The basic delay unit 221 may delay the level signal LIN. The first delay unit 222-1 may delay an output of the basic delay unit 221. Each of the second to nth delay units 222-2 to 222-n may delay an output of the delay unit at the previous stage. For example, the first to nth delay units 222-1 to 222-n may be configured to have the same delay amount, and the basic delay unit 221 may have a different delay amount from the first to nth delay units 222-1 to 222-n.

The characteristic information generator 230 may be coupled to output terminals of the plurality of delay units, and generate the characteristic information OP<0:n> based on the signals outputted from the respective delay units. When the reference signal REF is enabled, the characteristic information generator 230 may receive the signals outputted from the plurality of delay units, and generate the characteristic information OP<0:n> based on the received signals. The characteristic information generator 230 may include a plurality of flip-flops. The plurality of flip-flops may have input terminals coupled to the output terminals of the basic delay unit 221 and the first to nth delay units 222-1 to 222-n, respectively, and receive the signals outputted from the basic delay unit 221 and the first to nth delay units 222-1 to 222-n through the input terminals. The plurality of flip-flops may receive the reference signal REF through clock terminals thereof. The plurality of flip-flops may include DQ flip-flops. When the reference signal REF is enabled, the plurality of flip-flops may output the signals from the basic delay unit 221 and the first to nth delay units 222-1 to 222-n through output terminals thereof. The signals outputted through the output terminals of the plurality of flip-flops may be provided as the characteristic information OP<0:n>. The characteristic information generator 230 may further include an encoder 231. The encoder 231 may receive the signals outputted from the plurality of flip-flops, and generate the characteristic information OP<0:n> by encoding the received signals. The encoder 231 may be selectively installed in order to specify the bit number of the signals constituting the characteristic information OP<0:n>.

The basic delay unit 221 and the first to nth delay units 222-1 to 222-n may be configured by replicating the logic circuit 110. Therefore, the delay line 220 may have substantially the same characteristic as the logic circuit 110. As the process variation of the logic circuit 110 becomes faster and exceeds the reference variation, the delay amount of the delay line 220 is decreased. On the other hand, as the process variation of the logic circuit 110 becomes slower than the reference variation, the delay amount of the delay line 220 is increased. Furthermore, the delay amount of the delay line 220 may be changed based on the temperature at which the logic circuit 110 is operated. The operating speed of the semiconductor apparatus 1 may be changed depending on temperature. The temperature at which the semiconductor apparatus is operated may be related to the mobility of transistors. Thus, the semiconductor apparatus may be operated at higher speed when the temperature at which the semiconductor apparatus is operated is lower, but be operated at lower speed when the temperature at which the semiconductor apparatus is operated is higher. Recently, however, the reduction in tech of semiconductor apparatuses has lowered the level of the threshold voltage of transistors. The temperature may change the level of the threshold voltage of the transistors. Therefore, as the temperature at which the semiconductor apparatus is operated is higher, the semiconductor apparatus may be operated at quicker speeds. Furthermore, as the temperature at which the semiconductor apparatus is operated is lower, the semiconductor apparatus may be operated at slower speeds. Therefore, the delay amount of the delay line 220 may be changed depending on the temperature at which the logic circuit 110 is operated. When the logic circuit 110 is operated at high speed based on the process variation and/or temperature variation, the level signal LIN may reach the nth delay unit 222-n until the reference signal REF is enabled. When the reference signal REF is enabled, all of the plurality of flip-flops may generate output signals having a logic high level. Therefore, the characteristic information OP<0:n> may have a logic value of "1, 1, 1, . . . , 1, 1, 1, 1". On the other hand, when the logic circuit 110 is operated at low speed based on the process variation and/or temperature variation, the level signal LIN may not reach the nth delay unit 222-$n$ until the reference signal REF is enabled. When the reference signal REF is enabled, a part of the flip-flops may generate output signals having a logic low level, and the characteristic information OP<0:n> may have a logic value of "1, 1, 1, . . . , 0, 0, 0, 0", for example. Furthermore, when the logic circuit 110 is operated at a speed between the above-described two cases based on the process variation and/or temperature variation, the characteristic information OP<0:n> may have a logic value between the two logic values. Therefore, the characteristic monitoring circuit 130 may monitor the process and temperature variations of the logic circuit 110, and generate the characteristic information OP<0:n> depending on the characteristics of the logic circuit 110.

Figure 3:
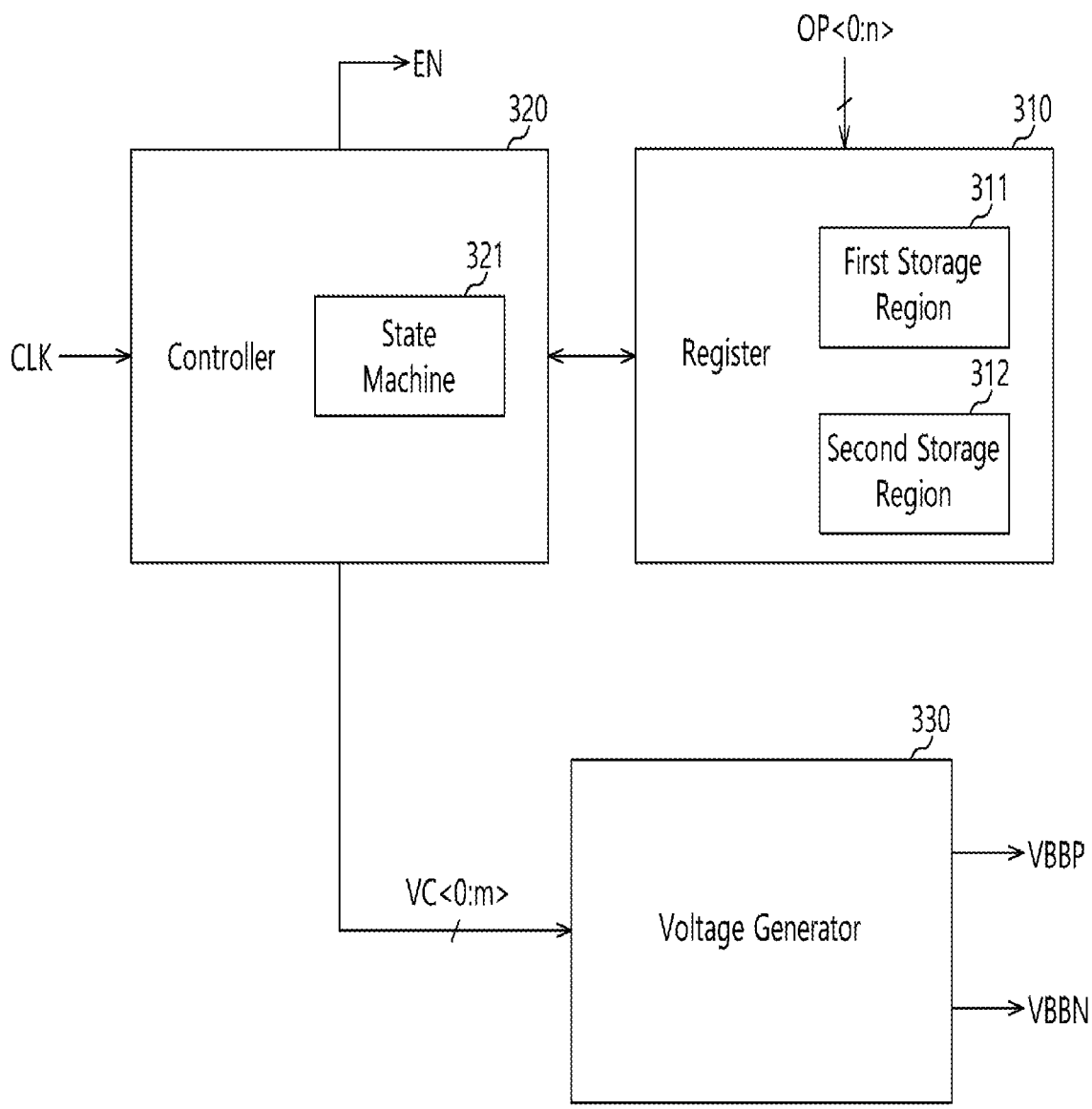
FIG. 3 is a diagram illustrating a representation of an example of the configuration of a power gating control circuit illustrated in FIG. 1.

FIG. 3 is a diagram illustrating a representation of an example of the configuration of a power gating control circuit 140 illustrated in FIG. 1. Referring to FIG. 3, the power gating control circuit 140 may include a register 310, a controller 320 and a voltage generator 330. The register 310 may store the characteristic information OP<0:n> generated through the characteristic monitoring circuit 130. The register 310 may include first and second storage regions 311 and 312. For example, the first storage region 311 may store the characteristic information OP<0:n> when the semiconductor apparatus 1 is operated at the first frequency. The second storage region 312 may store the characteristic information OP<0:n> when the semiconductor apparatus 1 is operated at the second frequency. The characteristic information stored in the first storage region 311 may include fast mode characteristic information. The characteristic information stored in the second storage region 312 may include slow mode characteristic information. The characteristic information OP<0:n> stored in the first and second storage regions 311 and 312 may be updated whenever the characteristic monitoring circuit 130 performs a monitoring operation.

The controller 320 may generate the enable signal EN, and generate a voltage code VC<0:m> based on the characteristic information OP<0:n>, where m is an integer equal to or more than 1. The controller 320 may enable the enable signal EN when the semiconductor apparatus 1 is booted up. Furthermore, the controller 320 may periodically enable the enable signal EN. The controller 320 may receive the characteristic information OP<0:n> from the register 310. The controller 320 may change the logic value of the voltage code VC<0:mm> based on the characteristic information OP<0:n>. The controller 320 may include a state machine 321. The state machine 321 may include the default value of the voltage code VC<0:m>. The state machine 321 may increase or decrease the value of the voltage code VC<0:m> to a value larger or smaller than the default value, based on the characteristic information OP<0:n>. The controller 320 may receive the clock signal CLK, and determine the operating speed of the semiconductor apparatus 1 based on the clock signal CLK. When the first semiconductor apparatus 1 is operated at the first frequency, the controller 320 may access the first storage region 311, and receive the fast mode characteristic information stored in the first storage region 311. The controller 320 may generate the voltage code VC<0:m> based on the fast mode characteristic information. When the semiconductor apparatus 1 is operated at the second frequency, the controller 320 may access the second storage region 312, and receive the slow mode characteristic information stored in the second storage region 312. The controller 320 may generate the voltage code VC<0:m> based on the slow mode characteristic information.

The voltage generator 330 may generate the first and second back bias voltages VBBP and VBBN based on the voltage code VC<0:m>. The voltage generator 330 may generate the first and second back bias voltages VBBP and VBBN having a level that changes according to the value of the voltage code VC<0:m>. The first and second back bias voltages VBBP and VBBN may be provided to the bodies or bulks of the first and second gating transistors 121 and 122 constituting the power gating circuit 120, respectively.

Figure 4:
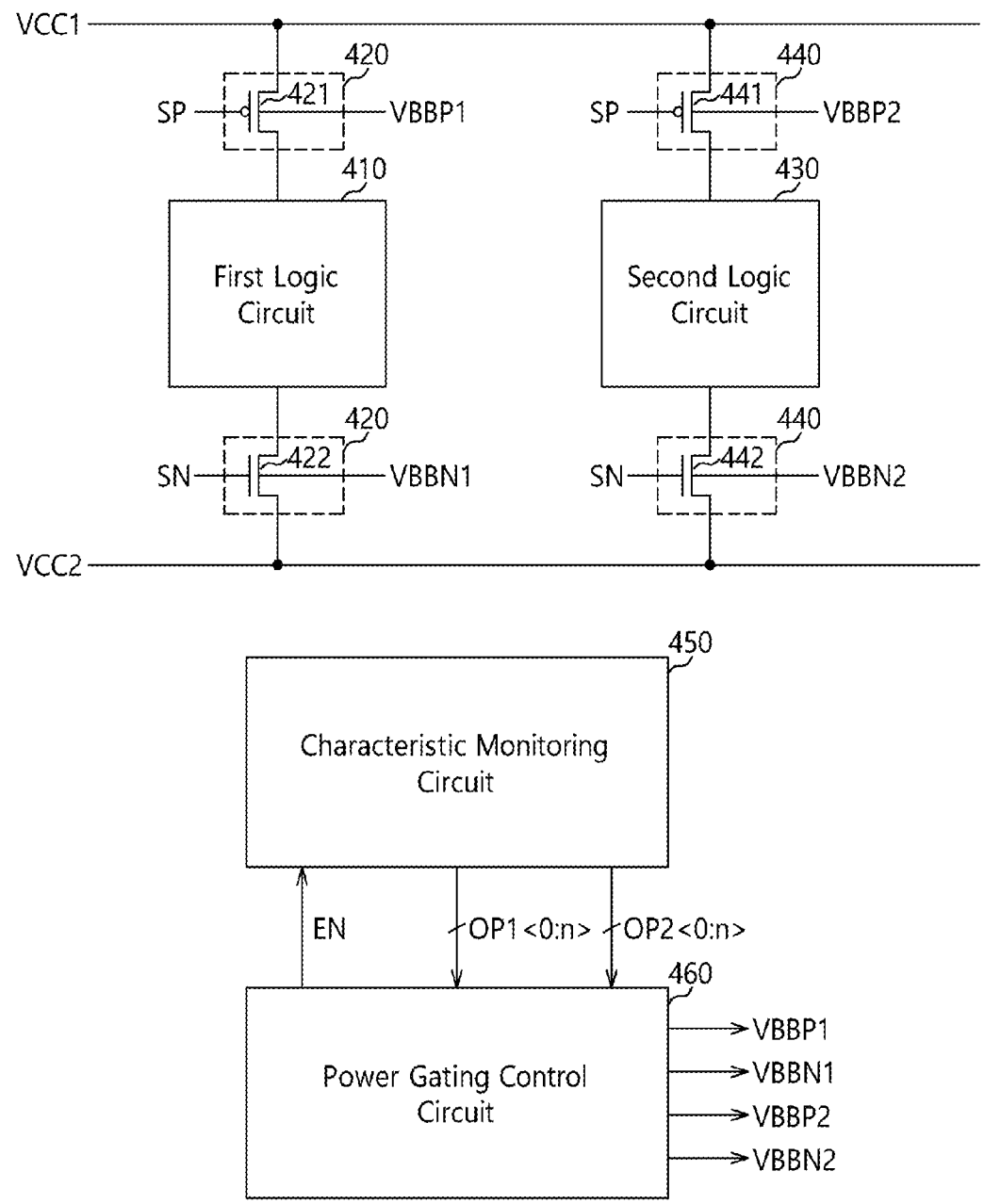
FIG. 4 is a diagram illustrating a representation of an example of the configuration of a semiconductor apparatus according to an embodiment.

FIG. 4 is a diagram illustrating a representation of an example of the configuration of a semiconductor apparatus 4 according to an embodiment. Referring to FIG. 4, the semiconductor apparatus 4 may include a first logic circuit 410, a first power gating circuit 420, a second logic circuit 430 and a second power gating circuit 440. The first and second logic circuits 410 and 430 may be operated by first and second supply voltages VCC1 and VCC2 applied thereto. The first and second logic circuits 410 and 430 may have different characteristics. The first power gating circuit 420 may include a first gating transistor 421, and the first gating transistor 421 may apply the first supply voltage VCC1 to the first logic circuit 410 based on a gating control signal SP. The second power gating circuit 440 may include a second gating transistor 441, and the second gating transistor 441 may apply the first supply voltage VCC1 to the second logic circuit 430 based on the gating control signal SP. The first gating transistor 421 may receive a first back bias voltage VBBP1 through a body or bulk thereof, and the second gating transistor 441 may receive a second back bias voltage VBBP2 through a body or bulk thereof. The first back bias voltage VBBP1 may have a level that changes based on a characteristic of the first logic circuit 410, and the second back bias voltage VBBP2 may have a level that changes based on a characteristic of the second logic circuit 430.

The first power gating circuit 420 may further include a third gating transistor 422. The third gating transistor 422 may apply the second supply voltage VCC2 to the first logic circuit 410 based on a gating control signal SN. The gating control signal SN may correspond to an inverted signal of the gating control signal SP. The third gating transistor 422 may receive a third back bias voltage VBBN1 through a body or bulk thereof. The third back bias voltage VBBN1 may have a level that changes based on the characteristic of the first logic circuit 410. The second power gating circuit 440 may further include a fourth gating transistor 442. The fourth gating transistor 442 may apply the second supply voltage VCC2 to the second logic circuit 430 based on the gating control signal SN. The fourth gating transistor 442 may receive a fourth back bias voltage VBBN2 through a body or bulk thereof. The fourth back bias voltage VBBN2 may have a level that changes based on the characteristic of the second logic circuit 430.

The semiconductor apparatus 4 may adjust the first and third back bias voltages VBBP1 and VBBN1 based on the characteristic of the first logic circuit 410, and adjust the levels of the second and fourth back bias voltages VBBP2 and VBBN2 based on the characteristic of the second logic circuit 430. The semiconductor apparatus 4 may include a characteristic monitoring circuit 450 and a power gating control circuit 460. The characteristic monitoring circuit 450 may generate first characteristic information OP1<0:n> by monitoring the characteristic of the first logic circuit 410, and generate second characteristic information OP2<0:n> by monitoring the characteristic of the second logic circuit 430. The characteristic monitoring circuit 450 may include a delay line configured by replicating the first logic circuit 410 in order to monitor the characteristic of the first logic circuit 410, and include a delay line configured by replicating the second logic circuit 430 in order to monitor the characteristic of the second logic circuit 430. The characteristic monitoring circuit 450 may receive an enable signal EN from the power gating control circuit 460. The characteristic monitoring circuit 450 may be enabled when the enable signal EN is enabled, and generate the first and second characteristic information OP1<0:n> and OP2<0:n> by monitoring the characteristics of the first and second logic circuits 410 and 430.

The power gating control circuit 460 may generate the first and third back bias voltages VBBP1 and VBBN1 based on the first characteristic information OP1<0:n>, the first and third back bias voltages VBBP1 and VBBN1 being applied to the first and third gating transistors 421 and 422 of the first power gating circuit 420 coupled to the first logic circuit 410. The power gating control circuit 460 may generate the second and fourth back bias voltages VBBP2 and VBBN2 based on the second characteristic information OP2<0:n>, the second and fourth back bias voltages VBBP2 and VBBN2 being applied to the second and fourth gating transistors 441 and 442 of the second power gating circuit 440 coupled to the second logic circuit 430. The power gating control circuit 460 may generate the enable signal EN to enable the characteristic monitoring circuit 450. The semiconductor apparatus 4 may include various logic circuits, and the various logic circuits may have individual characteristics. The semiconductor apparatus 4 may separately monitor the characteristics of the respective logic circuits, and separately adjust the levels of the back bias voltages applied to the bodies or bulks of the gating transistors of the power gating circuits coupled to the respective logic circuits. Therefore, the power gating efficiency optimized to each of the logic circuits can be obtained.

Figure 5:
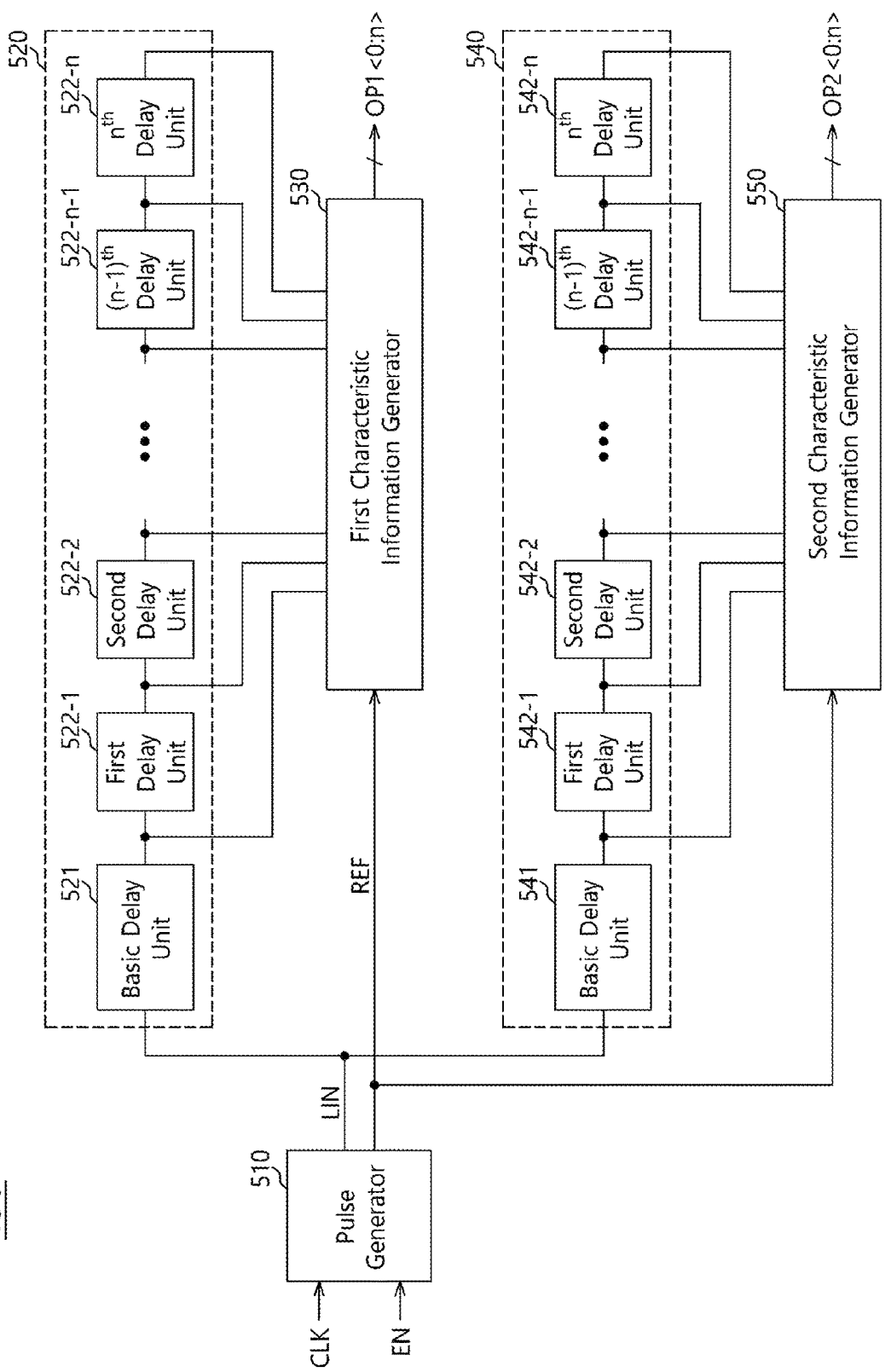
FIG. 5 is a diagram illustrating a representation of an example of the configuration of a characteristic monitoring circuit illustrated in FIG. 4.

FIG. 5 is a diagram illustrating a representation of an example of the configuration of a characteristic monitoring circuit 450 illustrated in FIG. 4. Referring to FIG. 5, the characteristic monitoring circuit 450 may include a pulse generator 510, a first delay line 520, a first characteristic information generator 530, a second delay line 540 and a second characteristic information generator 550. The pulse generator 510 may receive a clock signal CLK and generate a level signal LIN and a reference signal REF. When the enable signal EN is enabled, the pulse generator 510 may be enabled to generate the level signal LIN and the reference signal REF from the clock signal CLK.

The first delay line 520 may include a plurality of delay units, and the plurality of delay units may include a basic delay unit 521 and first to nth delay units 521-1 to 522-n. The basic delay unit 521 and the first to nth delay units 522-1 to 522-n may be coupled in series, and sequentially delay the level signal LIN. When the reference signal REF is enabled, the first characteristic information generator 530 may receive signals outputted from the basic delay unit 521 and the first to nth delay units 522-1 to 522-n, and generate the first characteristic information OP1<0:n> based on the received signals. Since the first delay line 520 is configured by replicating the first logic circuit 410, the first characteristic information OP1<0:n> may include a result obtained by monitoring a process variation and/or temperature variation of the first logic circuit 410. The first characteristic information generator 530 may have substantially the same configuration as the characteristic information generator 230 illustrated in FIG. 2.

The second delay line 540 may include a plurality of delay units, and the plurality of delay units may include a basic delay unit 541 and first to nth delay units 542-1 to 542-n. The basic delay unit 541 and the first to nth delay units 542-1 to 542-n may be coupled in series, and sequentially delay the level signal LIN. When the reference signal REF is enabled, the second characteristic information generator 550 may receive signals outputted from the basic delay unit 541 and the first to nth delay units 542-1 to 542-n, and generate the second characteristic information OP2<0:n> based on the received signals. Since the second delay line 540 is configured by replicating the second logic circuit 430, the second characteristic information OP2<0:n> may include a result obtained by monitoring a process variation and/or temperature variation of the second logic circuit 430. The second characteristic information generator 550 may have substantially the same configuration as the characteristic information generator 230 illustrated in FIG. 2.

Figure 6:
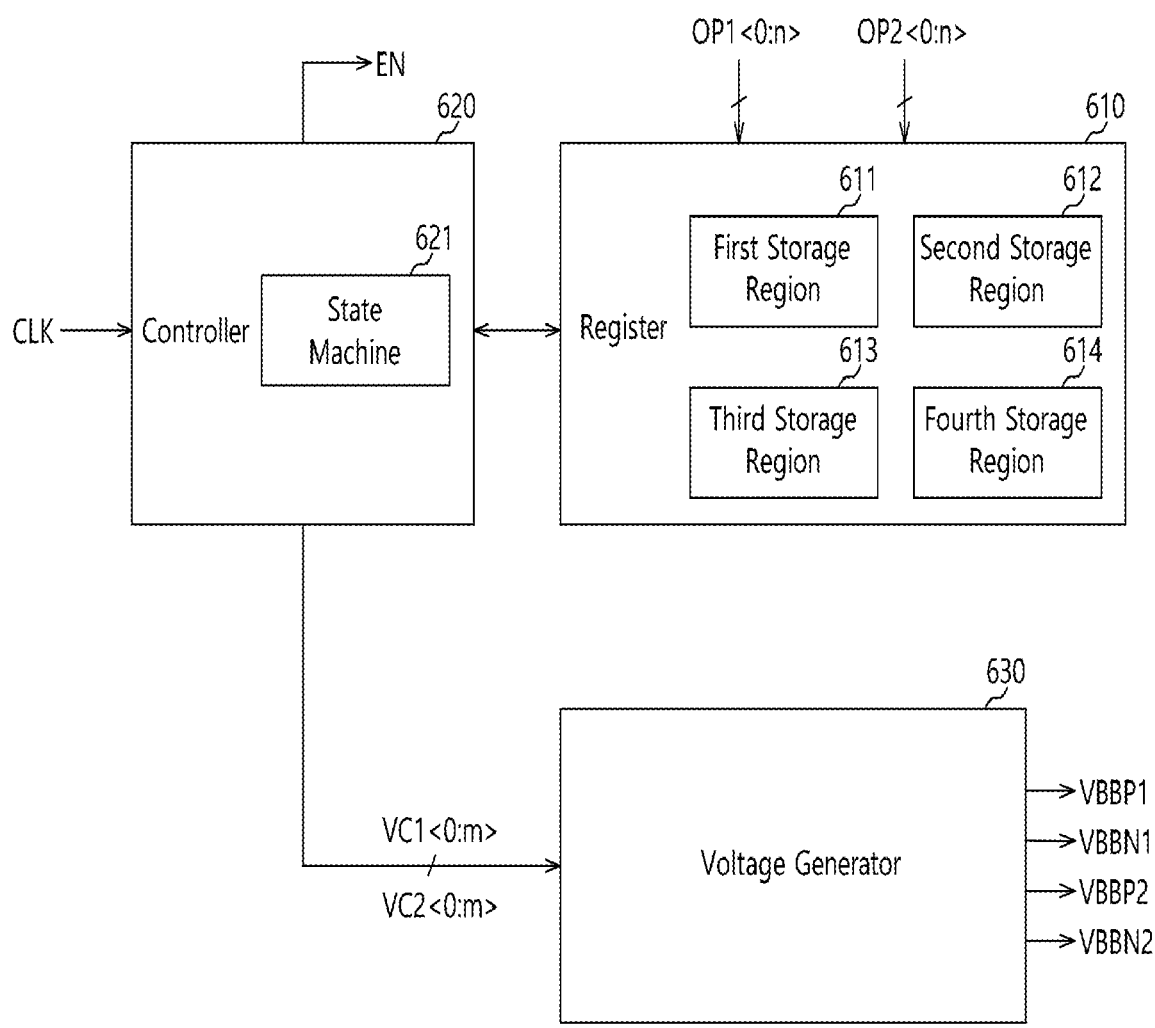
FIG. 6 is a diagram illustrating a representation of an example of the configuration of a power gating control circuit illustrated in FIG. 4.

FIG. 6 is a diagram illustrating a representation of an example of the configuration of the power gating control circuit 460 illustrated in FIG. 4. Referring to FIG. 6, the power gating control circuit 460 may include a register 610, a controller 620 and a voltage generator 630. The register 610 may store the first and second characteristic information OP1<0:n> and OP2<0:n>. The register 610 may include first to fourth storage regions 611 to 614. The first storage region 611 may store the first characteristic information OP1<0:n> generated through the characteristic monitoring circuit 450 when the semiconductor apparatus 4 is operated at a first frequency, and the second storage region 612 may store the first characteristic information OP1<0:n> generated through the characteristic monitoring circuit 450 when the semiconductor apparatus 4 is operated at a second frequency lower than the first frequency. The first characteristic information OP1<0:n> stored in the first storage region 611 may include first fast mode characteristic information, and the first characteristic information OP1<0:n> stored in the second storage region 612 may include first slow mode characteristic information. The third storage region 613 may store the second characteristic information OP2<0:n> generated through the characteristic monitoring circuit 450 when the semiconductor apparatus 4 is operated at the first frequency, and the fourth storage region 614 may store the second characteristic information OP2<0:n> generated through the characteristic monitoring circuit 450 when the semiconductor apparatus 4 is operated at the second frequency. The second characteristic information OP2<0:n> stored in the third storage region 613 may include second fast mode characteristic information, and the second characteristic information OP2<0:n> stored in the fourth storage region 614 may include second slow mode characteristic information.

The controller 620 may generate the enable signal EN to enable the characteristic monitoring circuit 450. The controller 620 may periodically enable the enable signal EN when or after the semiconductor apparatus 4 is booted up. The controller 620 may generate a first voltage code VC1<0:m> based on the first characteristic information OP1<0:n> stored in the register 610, and generate a second voltage code VC2<0:m> based on the second characteristic information OP2<0:n> stored in the register 610. The controller 620 may include a state machine 621. The state machine 621 may store the default values of the first and second voltage codes VC1<0:m> and VC2<0:m>. The state machine 621 may increase or decrease the value of the first voltage code VC1<0:m> to a value larger or smaller than the default value, based on the first characteristic information OP1<0:n>. The state machine 621 may increase or decrease the value of the second voltage code VC2<0:m> to a value larger or smaller than the default value, based on the second characteristic information OP2<0:n>.

The controller 620 may receive the clock signal CLK, and determine an operating speed of the semiconductor apparatus 4 based on the clock signal CLK. When the semiconductor apparatus 4 is operated at the first frequency, the controller 620 may access the first and third storage regions 611 and 613. The controller 620 may receive the first fast mode characteristic information stored in the first storage region 611 and the second fast mode characteristic information stored in the third storage region 613. The controller 620 may generate the first voltage code VC1<0:m> based on the first fast mode characteristic information, and generate the second voltage code VC2<0:m> based on the second fast mode characteristic information. When the semiconductor apparatus 4 is operated at the second frequency, the controller 620 may receive the first slow mode characteristic information stored in the second storage region 612 and the second slow mode characteristic information stored in the fourth storage region 614. The controller 620 may generate the first voltage code VC1<0:m> based on the first slow mode characteristic information, and generate the second voltage code VC2<0:m> based on the second slow mode characteristic information.

The voltage generator 630 may generate the first and third back bias voltages VBBP1 and VBBN1 based on the first voltage code VC1<0:m>, and generate the second and fourth back bias voltages VBBP2 and VBBN2 based on the second voltage code VC2<0:m>. The first and third back bias voltages VBBP1 and VBBN1 may be applied to the bodies or bulks of the first and third gating transistors 421 and 422 of the first power gating circuit 420 coupled to the first logic circuit 410. The second and fourth back bias voltages VBBP2 and VBBN2 may be applied to the bodies or bulks of the second and fourth gating transistors 441 and 442 of the second power gating circuit 440 coupled to the second logic circuit 430.

Figure 7:
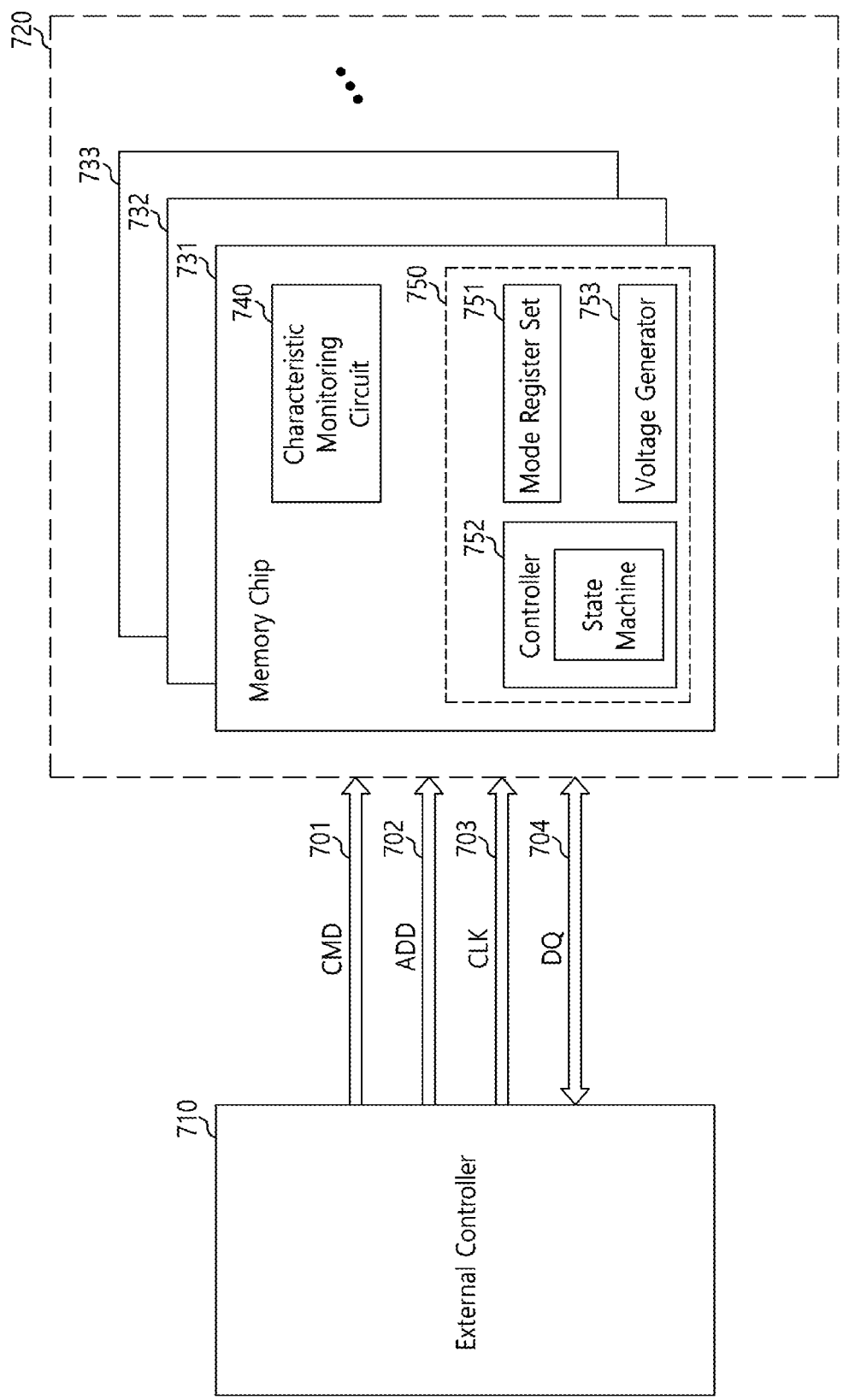
FIG. 7 is a diagram illustrating a representation of an example of the configuration of a semiconductor system according to an embodiment.

FIG. 7 is a diagram illustrating a representation of an example of the configuration of a semiconductor system 7 according to an embodiment. Referring to FIG. 7, the semiconductor system 7 may include an external controller 710 and a memory device 720. The external controller 710 and the memory device 720 may perform data communication therebetween. The external controller 710 may provide various control signals to the memory device 720 such that the memory device 720 can perform a data input/output operation. For example, the external controller 710 may provide a command signal CMD, an address signal ADD, a clock signal CLK and data DQ to the memory device 720, such that the memory device 720 can store and output the data. An operation of transmitting data from the external controller 710 to the memory device 720 and storing the transmitted data in the memory device 720 may be referred to as a write operation. Furthermore, an operation of transmitting data outputted from the memory device 720 to the external controller 710 may be referred to as a read operation. During the write operation, the external controller 710 may provide the command signal CMD, the address signal ADD and the data DQ to the memory device 720. During the read operation, the external controller 710 may provide the command signal CMD and the address signal ADD to the memory device 720, and the memory device 720 may output the data DQ to the controller 710. The external controller 710 and the memory device 720 may be coupled through a plurality of buses, and the plurality of buses may include a command bus 701 through which the command signal CMD is transmitted, an address bus 702 through which the address signal ADD is transmitted, a clock bus 703 through which the clock signal CLK is transmitted, and a data bus 704 through which the data are transmitted. In an embodiment, the command signal CMD and the address signal ADD may be transmitted as one signal. The external controller 710 may include a physical layer serving as an interface circuit for transmitting the command signal CMD, the address signal ADD, the clock signal CLK and the data DQ. The external controller 710 may include a CPU (Central Processing Unit), a GPU (Graphic Processing Unit), an MMP (Multi-Media Processor), a digital signal processor and a memory controller. Furthermore, processor chips such as an AP (Application Processor), which have various functions, may be combined and implemented in the form of SOC (System On Chip).

The memory device 720 may include one or more memory chips. FIG. 7 illustrates that the memory device 720 includes three memory chips 731 to 733, and the number of memory chips may not be limited thereto. The memory device 720 may include different types of memory chips as well as the same kind of memory chips. The memory device 720 may include a memory module having a plurality of memory chips or a multi-chip package having a plurality of memory chips stacked therein. The memory device 720 and the external controller may be implemented in various types such as SOC, SIP (System In Package) and POP (Package On Package). The memory chips 731 to 733 may include a volatile memory and a nonvolatile memory. The volatile memory may include an SRAM (Static RAM), DRAM (Dynamic RAM) and SDRAM (Synchronous DRAM), and the nonvolatile memory may include a ROM (Read Only Memory), PROM (Programmable ROM), EEPROM (Electrically Erase and Programmable ROM), EPROM (Electrically Programmable ROM), Flash memory, PRAM (Phase change RAM), MRAM (Magnetic RAM), RRAM (Resistive RAM), FRAM (Ferroelectric RAM) and the like.

The external controller 710 and the memory device 720 may perform a training operation. The training operation may indicate an operation for adjusting the levels of back bias voltages applied to gating transistors of power gating circuits coupled to logic circuits positioned in the respective memory chips 731 to 733. The external controller 710 may transmit a training command as the command signal CMD to the memory device 720. The external controller 710 may periodically transmit the training command to the memory device 720 when or after the semiconductor system 7 is booted up. When the memory device 720 receives the training command from the external controller 710, the memory device 720 may monitor the characteristics of the logic circuits installed in the respective memory chips 731 to 733, and store the monitoring results as characteristic information. The memory chips 731 to 733 may include components for performing the training operation, and have substantially the same configuration. The memory chip 731 may include a characteristic monitoring circuit 740 and a power gating control circuit 750. The characteristic monitoring circuits 130 and 450 illustrated in FIGS. 1 and 4 may be applied as the characteristic monitoring circuit 740. The power gating control circuit 750 may include a mode register set 751, a controller 752 and a voltage generator 753. The controllers 320 and 620 illustrated in FIGS. 3 and 6 may be applied as the controller 752, and the controller 752 may include a state machine. The controller 752 may generate an enable signal to enable the characteristic monitoring circuit 740, based on the training command transmitted from the external controller 710. The mode register set 751 may perform a function corresponding to the registers 310 and 610 illustrated in FIGS. 3 and 6. The memory chip 731 may store the characteristic information in the mode register set 751. The voltage generators 330 and 640 illustrated in FIGS. 3 and 6 may be applied as the voltage generator 753. The training operation may be separately performed on the plurality of memory chips 731 to 733.

While various embodiments have been described above, it will be understood to those skilled in the art that the embodiments described are examples only. Accordingly, the operating method of a data storage device described herein should not be limited based on the described embodiments.

What is claimed is:

1. A semiconductor apparatus comprising:
   a logic circuit;
   a power gating circuit comprising a first gating transistor configured to apply a first supply voltage to the logic circuit based on an operation mode of the semiconductor apparatus;
   a characteristic monitoring circuit configured to generate characteristic information by monitoring a characteristic of the logic circuit, wherein the characteristic of the logic circuit comprises at least one of process variation and temperature variation; and
   a power gating control circuit configured to supply a first back bias voltage to the first gating transistor based on the characteristic information.

2. The semiconductor apparatus of claim 1, wherein the characteristic monitoring circuit comprises:
   a pulse generator configured to receive a clock signal and generate a level signal and reference signal;
   a delay line comprising a plurality of delay units configured by replicating the logic circuit, wherein the plurality of delay units sequentially delays the level signal; and
   a characteristic information generator configured to generate the characteristic information from outputs of the plurality of delay units based on the reference signal.

3. The semiconductor apparatus of claim 2, wherein the characteristic information generator comprises:
   a plurality of flip flops coupled to the outputs of the corresponding delay units among the plurality of delay units, and configured to receive the outputs of the corresponding delay units based on the reference signal, respectively; and
   an encoder configured to generate the characteristic information by encoding output signals of the plurality of flip-flops.

4. The semiconductor apparatus of claim 2,
   wherein the delay amount of the delay line is changed depending on a temperature at which the logic circuit is operated at; and
   wherein the delay amount of the delay line is changed depending on a process variation of the logic circuit based on a reference variation.

5. The semiconductor apparatus of claim 1, wherein the power gating control circuit comprises:
   a register configured to receive and store the characteristic information;
   a controller configured to provide an enable signal to the characteristic information monitoring circuit, and to generate a voltage code based on the characteristic information stored in the register; and
   a voltage generator configured to generate the first back bias voltage based on the voltage code.

6. The semiconductor apparatus of claim 5, wherein the register stores the characteristic information as fast mode characteristic information when the semiconductor apparatus is operated at a first frequency, and stores the characteristic information as slow mode characteristic information when the semiconductor apparatus is operated at a second frequency lower than the first frequency.

7. The semiconductor apparatus of claim 6, wherein the controller receives the fast mode characteristic information when the semiconductor apparatus is operated at the first frequency, and receives the slow mode characteristic information when the semiconductor apparatus is operated at the second frequency.

8. The semiconductor apparatus of claim 5, wherein the enable signal is periodically enabled when and after the semiconductor apparatus is booted up, and enables the characteristic monitoring circuit.

9. The semiconductor apparatus of claim 5, wherein the power gating circuit further comprises a second gating transistor configured to apply a second supply voltage to the logic circuit based on the operation mode of the semiconductor apparatus, and
   the power gating control circuit supplies a second back bias voltage to the second gating transistor based on the characteristic information.

10. The semiconductor apparatus of claim 9, wherein the voltage generator further generates the second back bias voltage based on the voltage code.

11. A semiconductor apparatus comprising:
    a first logic circuit;
    a first power gating circuit comprising a first gating transistor configured to apply a first supply voltage to the first logic circuit based on an operation mode of the semiconductor apparatus;
    a second logic circuit;
    a second power gating circuit comprising a second gating transistor configured to apply the first supply voltage to the second logic circuit based on the operation mode of the semiconductor apparatus;
    a characteristic monitoring circuit configured to generate first characteristic information by monitoring a characteristic of the first logic circuit, and to generate second characteristic information by monitoring a characteristic of the second logic circuit, wherein the characteristics of the first and second logic circuits comprise at least one of process variation and temperature variation; and
    a power gating control circuit configured to provide a first back bias voltage to the first gating transistor based on the first characteristic information, and to provide a second back bias voltage to the second gating transistor based on the second characteristic information.

12. The semiconductor apparatus of claim 11, wherein the characteristic monitoring circuit comprises:
    a pulse generator configured to receive a clock signal and generate a level signal and reference signal;
    a first delay line comprising a plurality of delay units configured by replicating the first logic circuit, wherein the plurality of delay units sequentially delay the level signal;
    a first characteristic information generator configured to generate the first characteristic information from outputs of the plurality of delay units of the first delay line, based on the reference signal;

a second delay line comprising a plurality of delay units configured by replicating the second logic circuit, wherein the plurality of delay units sequentially delay the level signal; and a second characteristic information generator configured to generate the second characteristic information from outputs of the plurality of delay units of the second delay line.

13. The semiconductor apparatus of claim 12, wherein the delay amount of the first delay line is changed depending on a temperature at which the first logic circuit is operated at;

wherein the delay amount of the first delay line is changed depending on a process variation of the first logic circuit based on a reference variation;

wherein the delay amount of the second delay line is changed depending on a temperature at which the second logic circuit is operated at; and wherein the delay amount of the second delay line is changed depending on a process variation of the second logic circuit based on a reference variation.

14. The semiconductor apparatus of claim 11, wherein the power gating control circuit comprises:

a register configured to receive and to store the first and second characteristic information;

a controller configured to provide an enable signal to the characteristic monitoring circuit, to generate a first voltage code based on the first characteristic information stored in the register, and to generate a second voltage code based on the second characteristic information stored in the register; and a voltage generator configured to generate the first back bias voltage based on the first voltage code, and to generate the second back bias voltage based on the second voltage code.

15. The semiconductor apparatus of claim 14, wherein the register stores the first and second characteristic information as first and second fast mode characteristic information when the semiconductor apparatus is operated at a first frequency, and stores the first and second characteristic information as first and second slow mode characteristic information when the semiconductor apparatus is operated at a second frequency lower than the first frequency.

16. The semiconductor apparatus of claim 15, wherein the controller receives the first and second fast mode characteristic information when the semiconductor apparatus is operated at the first frequency, and receives the first and second slow mode characteristic information when the semiconductor apparatus is operated at the second frequency.

17. The semiconductor apparatus of claim 15, wherein the enable signal is periodically enabled when and after the semiconductor apparatus is booted up, and enables the characteristic monitoring circuit.

18. The semiconductor apparatus of claim 15, wherein the first power gating circuit further comprises a third gating transistor configured to supply a second supply voltage to the first logic circuit based on the operation mode of the semiconductor apparatus, and the voltage generator generates a third back bias voltage to provide to the third gating transistor, based on the first characteristic information.

19. The semiconductor apparatus of claim 15, wherein the second power gating circuit further comprises a fourth gating transistor configured to supply a second supply voltage to the second logic circuit based on the operation mode of the semiconductor apparatus, and the voltage generator generates a fourth back bias voltage to provide to the fourth gating transistor, based on the second characteristic information.

* * * * *